(12) United States Patent
Xie et al.

(10) Patent No.: US 11,295,983 B2
(45) Date of Patent: Apr. 5, 2022

(54) TRANSISTOR HAVING SOURCE OR DRAIN FORMATION ASSISTANCE REGIONS WITH IMPROVED BOTTOM ISOLATION

(71) Applicant: International Business Machines Corporation, Armonk, NY (US)

(72) Inventors: Ruilong Xie, Niskayuna, NY (US); Alexander Reznicek, Troy, NY (US); Effendi Leobandung, Stormville, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 16/884,183

(22) Filed: May 27, 2020

(65) Prior Publication Data
US 2021/0375685 A1 Dec. 2, 2021

(51) Int. Cl.
| | |
|---|---|
| *H01L 21/8234* | (2006.01) |
| *H01L 21/762* | (2006.01) |
| *H01L 29/06* | (2006.01) |
| *H01L 27/088* | (2006.01) |
| *H01L 29/775* | (2006.01) |

(52) U.S. Cl.
CPC ........ *H01L 21/823418* (2013.01); *H01L 21/76202* (2013.01); *H01L 21/823468* (2013.01); *H01L 29/0653* (2013.01)

(58) Field of Classification Search
CPC ..... H01L 29/0665; H01L 29/0669–068; H01L 29/7853–2029/7858; H01L 29/78687; H01L 29/78696; H01L 29/0843–0891; H01L 29/66636–66643; H01L 21/823418–823425; H01L 21/823814; H01L 29/41783; H01L 29/1041–1045; H01L 29/66537; H01L 29/66575–66598; H01L 29/66659; H01L 29/0653; H01L 21/823878

See application file for complete search history.

(56) References Cited

U.S. PATENT DOCUMENTS

| | | |
|---|---|---|
| 5,422,303 A | 6/1995 | Klose et al. |
| 8,574,968 B2 | 11/2013 | Arena et al. |
| 8,691,011 B2 | 4/2014 | Samuelson et al. |
| 8,828,849 B2 | 9/2014 | Wang |
| 9,614,068 B2 | 4/2017 | Seo |
| 9,947,804 B1 | 4/2018 | Frougier et al. |
| 10,103,238 B1 | 10/2018 | Zang et al. |

(Continued)

OTHER PUBLICATIONS

Miyamoto et al., "Regrown source/drain in InGaAs multi-gate MOSFETs," Journal of Crystal Growth 522 (2019): 11-15.

*Primary Examiner* — Sonya McCall-Shepard
(74) *Attorney, Agent, or Firm* — Cantor Colburn LLP; Jeffrey S LaBaw

(57) ABSTRACT

Embodiments of the invention are directed to a method of performing fabrication operations to form a transistor, wherein the fabrication operations include forming a source or drain (S/D) region having an S/D formation assistance region at least partially within a portion of a substrate. An S/D isolation region is formed around sidewalls and a bottom surface of the S/D formation assistance region and configured to electrically isolate the S/D formation assistance region from the substrate.

17 Claims, 13 Drawing Sheets

(56) References Cited

U.S. PATENT DOCUMENTS

| | | | |
|---|---|---|---|
| 10,249,710 B2 | 4/2019 | Bentley et al. | |
| 10,269,983 B2* | 4/2019 | Frougier | H01L 29/78654 |
| 10,276,442 B1 | 4/2019 | Xie et al. | |
| 11,107,812 B2* | 8/2021 | Chan | H01L 21/8221 |
| 2012/0141799 A1 | 6/2012 | Kub et al. | |
| 2017/0271514 A1* | 9/2017 | Kittl | H01L 29/42392 |
| 2019/0035888 A1 | 1/2019 | Wu | |
| 2019/0058052 A1 | 2/2019 | Frougier et al. | |
| 2019/0109052 A1* | 4/2019 | Reznicek | H01L 21/823807 |
| 2020/0006051 A1 | 1/2020 | Kim et al. | |
| 2020/0365692 A1* | 11/2020 | Jung | H01L 27/088 |
| 2021/0066477 A1* | 3/2021 | Lee | H01L 29/42392 |
| 2021/0082914 A1* | 3/2021 | Lee | H01L 29/785 |
| 2021/0126135 A1* | 4/2021 | Lee | H01L 29/42392 |

* cited by examiner

TRANSISTOR HAVING SOURCE OR DRAIN FORMATION ASSISTANCE REGIONS WITH IMPROVED BOTTOM ISOLATION

BACKGROUND

The present invention relates in general to fabrication methods and resulting structures for semiconductor devices. More specifically, the present invention relates to fabrication methods and resulting structures for transistors having source or drain (S/D) formation assistance regions with improved bottom isolation.

In contemporary semiconductor device fabrication processes, a large number of metal oxide semiconductor field effect transistors (MOSFETs), such as n-type field effect transistors (nFETs) and p-type field effect transistors (pFETs), are fabricated on a single wafer. Non-planar MOSFET architectures (e.g., fin-type FETs (FinFETs) and nanosheet FETs) can provide increased device density and increased performance over planar MOSFETs. For example, nanosheet FETs, in contrast to conventional planar MOSFETs, include a gate stack that wraps around the full perimeter of multiple stacked and spaced apart nanosheet channel regions for a reduced device footprint and improved control of channel current flow.

In nanosheet FETs, S/D regions can be formed using a variety of processes. A known S/D fabrication process uses exposed end regions of the nanosheets as seed (or nucleation) regions from which doped S/D regions are epitaxially grown.

SUMMARY

Embodiments of the invention are directed to a method of performing fabrication operations to form a transistor, wherein the fabrication operations include forming a source or drain (S/D) region having an S/D formation assistance region at least partially within a portion of a substrate. An S/D isolation region is formed around sidewalls and a bottom surface of the S/D formation assistance region and configured to electrically isolate the S/D formation assistance region from the substrate.

Embodiments of the invention are directed to a method of performing fabrication operations to form a transistor, wherein the fabrication operations include forming over a substrate a first nanosheet having a first nanosheet end region, wherein a sidewall surface of the first nanosheet end region defines a first portion of a source or drain (S/D) trench. A second nanosheet having a second nanosheet end region is formed over the first nanosheet, wherein a sidewall surface of the second nanosheet end region defines a second portion of the S/D trench. Formed over the substrate is a third nanosheet having a third nanosheet end region, wherein a sidewall surface of the third nanosheet end region defines third portion of the S/D trench. Formed over the third nanosheet is a fourth nanosheet having a fourth nanosheet end region, wherein a sidewall surface of the fourth nanosheet end region defines a fourth portion of the S/D trench. An S/D formation assistance region is formed within a portion of the substrate, wherein a top surface of the S/D formation assistance region defines a bottom surface of the S/D trench. An S/D region is formed in the S/D trench, wherein forming the S/D region includes growing a first portion of the S/D region from the sidewall surface of the first nanosheet end region; growing a second portion of the S/D region from the sidewall surface of the second nanosheet end region; growing a third portion of the S/D region from the sidewall surface of the third nanosheet end region; growing a fourth portion of the S/D region from the sidewall surface of the fourth nanosheet end region; and growing a fifth portion of the S/D region from the top surface of the S/D formation assistance region. Prior to the first portion merging with the third portion, the fifth portion merges with the second portion and the third portion to form a first merged portion of the S/D region.

Embodiments of the invention are directed to a transistor that includes a source or drain (S/D) region and an S/D formation assistance region of the S/D region. An isolation region is formed around sidewalls and a bottom surface of the S/D formation assistance region and configured to electrically isolate the S/D formation assistance region from the substrate.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-13 depict multiple cross-sectional views of a nanosheet-based structure after various fabrication operations for forming a transistor having source or drain (S/D) formation assistance regions with improved bottom isolation in accordance with aspects of the invention, in which:

FIG. 1 depicts cross-sectional views of the nanosheet-based structure after initial fabrication operations in accordance with aspects of the present invention;

FIG. 2 depicts a cross-sectional view of the nanosheet-based structure after additional fabrication operations in accordance with aspects of the present invention;

FIG. 3 depicts a cross-sectional view of the nanosheet-based structure after additional fabrication operations in accordance with aspects of the present invention;

FIG. 4 depicts a cross-sectional view of the nanosheet-based structure after additional fabrication operations in accordance with aspects of the present invention;

FIG. 5 depicts a cross-sectional view of the nanosheet-based structure after additional fabrication operations in accordance with aspects of the present invention;

FIG. 6 depicts a cross-sectional view of the nanosheet-based structure after additional fabrication operations in accordance with aspects of the present invention;

FIG. 7 depicts a cross-sectional view of the nanosheet-based structure after additional fabrication operations in accordance with aspects of the present invention;

FIG. 8 depicts a cross-sectional view of the nanosheet-based structure after additional fabrication operations in accordance with aspects of the present invention; and FIG. 9 depicts a cross-sectional view of the nanosheet-based structure after additional fabrication operations in accordance with aspects of the present invention;

FIG. 10 depicts a cross-sectional view of the nanosheet-based structure after fabrication operations in accordance with aspects of the present invention;

FIG. 11 depicts a cross-sectional view of the nanosheet-based structure after additional fabrication operations in accordance with aspects of the present invention;

FIG. 12 depicts a cross-sectional view of the nanosheet-based structure after additional fabrication operations in accordance with aspects of the present invention; and FIG. 13 depicts a cross-sectional view of the nanosheet-based structure after additional fabrication operations in accordance with aspects of the present invention.

DETAILED DESCRIPTION

Figure 1:
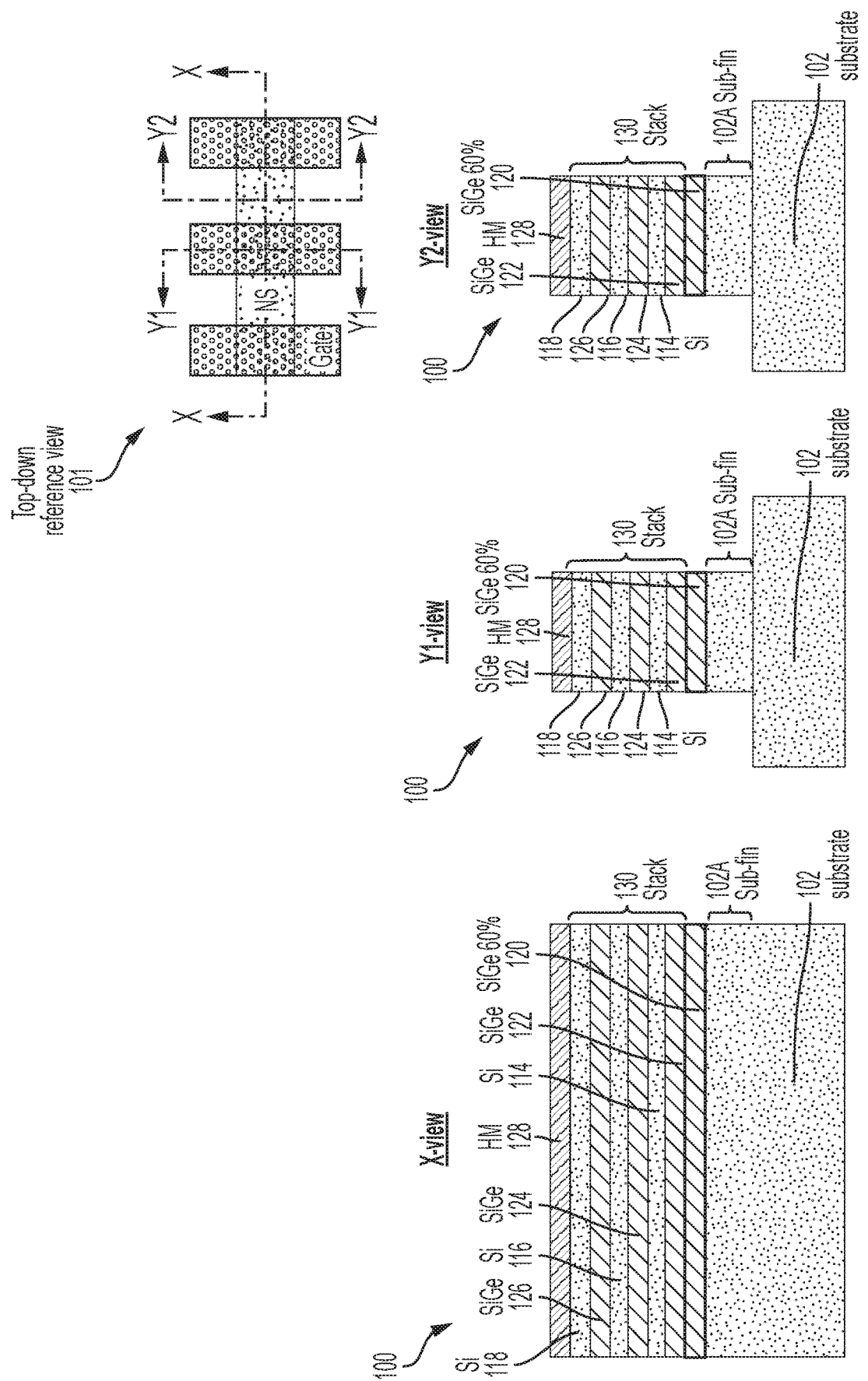

Although this detailed description includes examples of how aspects of the invention can be implemented to form a transistor having S/D formation assistance regions with improved bottom isolation, implementation of the teachings recited herein are not limited to a particular type of FET structure or combination of materials. Rather, embodiments of the present invention are capable of being implemented in conjunction with any other type of transistor device (planar, non-planar, p-FET, n-FET, fin-type FET) or material (e.g., Si or SiGe), now known or later developed, wherein it is desirable to provide S/D formation assistance regions with improved bottom isolation.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

The S/D regions of the transistor can be formed in S/D trenches by an epitaxial growth process in which separate individual S/D sub-regions are epitaxially grown from sidewall surfaces at end regions of the non-sacrificial nanosheets. As the epitaxial growth process continues, the S/D sub-regions merge to form a single S/D region. If the S/D sub-regions in the upper region of the S/D trench merge before S/D sub-regions in the bottom region of the S/D trench merge, the merged S/D region in the upper region of the S/D trench can cut off the flow of epitaxial gas/liquid to the S/D sub-regions in the bottom region of the S/D trench, which stops the epitaxial growth process in the lower region of the S/D trench before the S/D sub-regions in the lower region of the S/D trench merge. The unmerged sub-regions result in no S/D material being present in the bottom region of the S/D trench, which reduces the volume of S/D material, increases S/D resistance, and increases the transistor's switching times.

Turning now to an overview of aspects of the invention, embodiments of the invention address the above-described shortcomings in known S/D region fabrication processes by providing fabrication methods and resulting structures for forming S/D regions in transistors by incorporating S/D formation assistance regions with improved bottom isolation. In embodiments of the invention, alternating layers of non-sacrificial nanosheets and sacrificial nanosheets are etched into adjacent nanosheet stacks, and end regions of the sacrificial nanosheets in the adjacent nanosheet stacks are replaced with inner spacers formed from dielectric material. The space between adjacent nanosheet stacks defines sidewall portions of an S/D trench in which an S/D region will be formed. In accordance with aspects of the invention, an S/D formation assistance (or nucleation) region is formed in a portion of the transistor's substrate, and an exposed surface of the S/D assistance region defines a bottom surface of the S/D trench.

In embodiments of the invention, the S/D regions can be formed by an growth process in which separate individual S/D sub-regions are grown in a substantially lateral (or horizontal) direction from sidewall surfaces at end regions of the non-sacrificial nanosheets, as well as in a substantially vertical direction from the exposed surface of the S/D assistance region formed in the transistor's substrate. In embodiments of the invention, the S/D sub-regions can be epitaxially grown from gaseous or liquid precursors using, for example, vapor-phase epitaxy (VPE), molecular-beam epitaxy (MBE), liquid-phase epitaxy (LPE), or other suitable process.

Embodiments of the invention control the formation of "cross-trench" S/D sub-region mergers during formation of S/D regions. The terms "cross-trench" refer to a merged S/D sub-regions that spans across the S/D trench in a manner that blocks epitaxial gas and/or liquid from flowing to structures below the cross-trench merged S/D sub-regions. In accordance with aspects of the invention, the exposed surface of the S/D assistance region has a lateral width dimension that is larger than a vertical height (or thickness) of each of the sidewall surfaces at end regions of the non-sacrificial nanosheets. The width dimension of the exposed surface of the S/D assistance region ensures that the S/D sub-region that is vertically grown from the exposed surface of the S/D assistance region will merge with the S/D sub-regions near the bottom region of the S/D trench that are laterally grown from the sidewall surfaces at end regions of the non-sacrificial nanosheets before the S/D sub-regions at an upper regions of the S/D trench merge. Accordingly, gas or liquid flow to the S/D sub-regions in the lower region of the S/D trench is not cut off prematurely (i.e., before these lower region sub-regions merge), thereby ensuring that the epitaxial growth process in both the upper region and the lower region of the S/D trench is allowed to proceed until all of the S/D sub-regions have merged.

In embodiments of the invention, an S/D isolation region is formed in the transistor's substrate, and the S/D assistance region is formed within the S/D isolation region. The S/D isolation region is configured to electrically isolate the S/D formation assistance region from the substrate. In some embodiments of the invention, a first bottom isolation region is positioned between one nanosheet stack and the substrate, and a second bottom isolation region is positioned between the adjacent nanosheet stack and the substrate. In some embodiments of the invention, the first bottom isolation region is physically coupled to the S/D isolation region, and the second bottom isolation region is physically coupled to the S/D isolation region. In some embodiments of the invention, a vertical depth dimension of the first bottom isolation region is less than a vertical depth dimension of the S/D isolation region. In some embodiments of the invention, a vertical depth dimension of the second bottom isolation region is less than a vertical depth dimension of the S/D isolation region.

Turning now to a more detailed description of fabrication operations and resulting structures according to aspects of the invention, FIGS. 1-13 depict a nanosheet-based structure 100 after various fabrication operations for forming nanosheet FETs having S/D formation assistance regions with improved bottom isolation. For ease of illustration, the fabrication operations depicted in FIGS. 1-13 will be described in the context of forming 1-3 nanosheet stacks 130 (shown in FIG. 1). It is intended, however, that fabrication operations described herein apply equally to the fabrication of any number of the nanosheet stacks 130.

Although the cross-sectional diagrams depicted in FIGS. 1-13 are two-dimensional, it is understood that the diagrams depicted in FIGS. 1-13 represent three-dimensional structures. To assist with visualizing the three-dimensional features, the top-down reference diagram 101 shown in FIG. 1 provides a reference point for the various cross-sectional views (X-view, Y1-view, and Y2-view) shown in FIGS. 1-13. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, the nanosheet stack 130 is formed over the substrate 102. The nanosheet stack 130 includes an alternating series of SiGe sacrificial nanosheet layers 120, 122, 124, 126 and Si nanosheet layers 114, 116, 118. In accordance with aspects of the invention, the alternating nanosheet layers 120, 122, 114, 124, 116, 126, 118 of the nanosheet stack 130 are formed by epitaxially growing one nanosheet layer then the next until the desired number and desired thicknesses of the nanosheet layers are achieved. A hard mask layer (not shown) is deposited over the alternating nanosheet layers 120, 122, 114, 124, 116, 126, 118, and the hard mask layer and the alternating nanosheet layers 120, 122, 114, 124, 116, 126, 118 are etched to define the hard mask (HM) 128, the nanosheet stack 130, and the sub-fin 102A of the substrate 102. The hard mask layer and the resulting HM 128 can be any suitable dielectric, including but not limited to SiN.

In embodiments of the invention, each of the nanosheet layers 120, 122, 114, 124, 116, 126, 118 can have a vertical direction thickness in the range from about 5 nm to about 20 nm, in the range from about 10 nm to about 15 nm, or about 10 nm. Other vertical direction thicknesses are contemplated. Although eight alternating layers 120, 122, 114, 124, 116, 126, 118 are depicted in the figures, any number of alternating layers can be provided.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the SiGe sacrificial nanosheet layers 122, 124, 126 can be about SiGe 20%. The notation "SiGe 20%" is used to indicate that 20% of the SiGe material is Ge and 80% of the SiGe material is Si. In some embodiments of the invention, the Ge percentage in the SiGe sacrificial nanosheet layers 122, 124, 126 can be any value, including, for example a value within the range from about 20% to about 45%.

In embodiments of the invention, the SiGe sacrificial nanosheet layer 120 has a Ge percentage that is sufficiently greater than the Ge percentage in the SiGe sacrificial nanosheet layers 122, 124, 126 to provide etch selectivity between the sacrificial nanosheet layer 120 and the sacrificial nanosheet layers 122, 124, 126. In some aspects of the invention, the Ge percentage in the SiGe sacrificial nanosheet layer 120 is above about 55%. In some aspects of the invention, the sacrificial nanosheet layers 122, 124, 126 can be SiGe 25%, and the sacrificial nanosheet layer 120 can be at or above about SiGe 55%.

Figure 2:
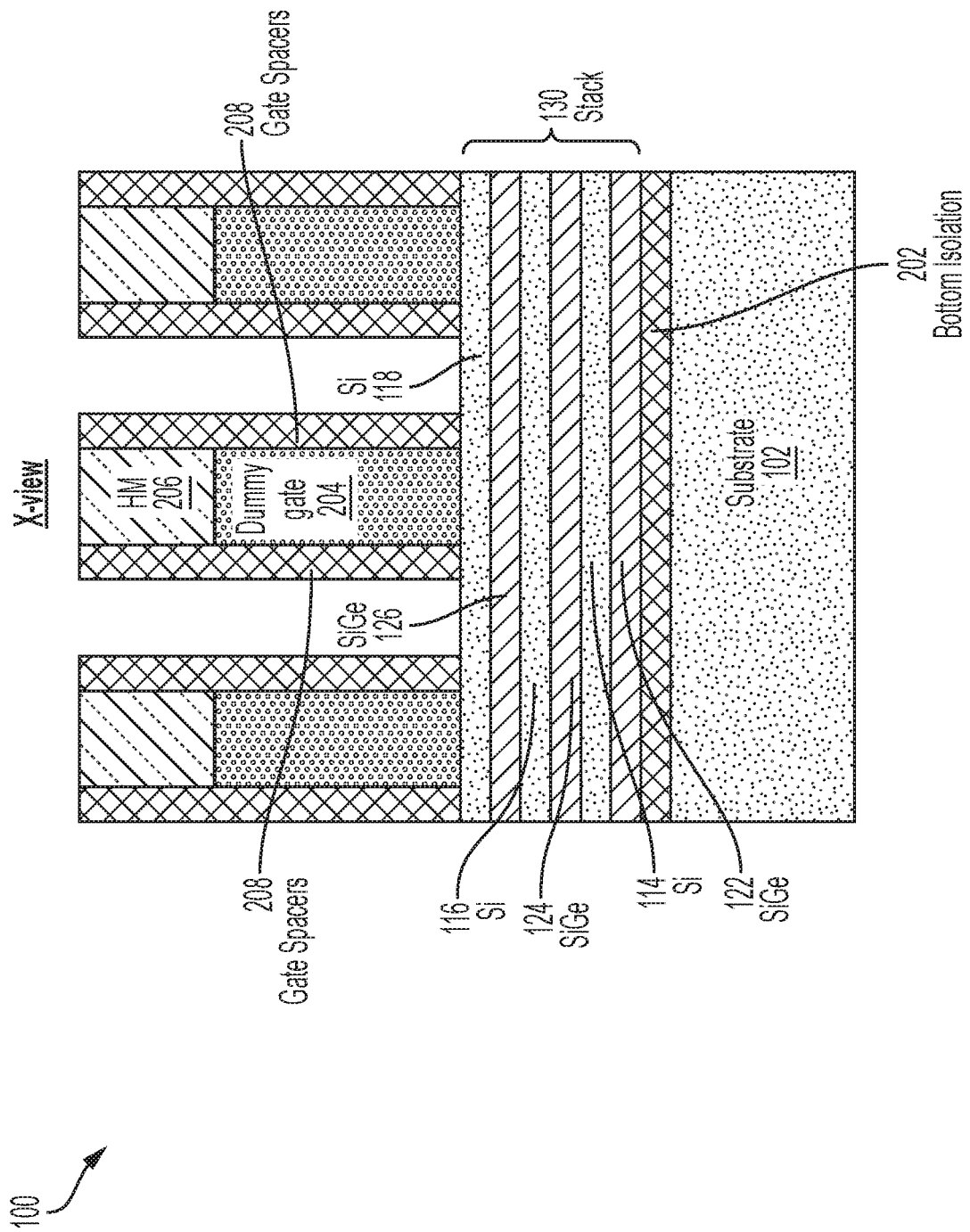

In FIG. 2, known fabrication operations have been used to selectively remove the HM 128 (shown in FIG. 1) and the sacrificial nanosheet layer 120 (shown in FIG. 1) and replace the layer 120 with a bottom isolation region 202. In embodiments of the invention, the dielectric material used to form the bottom isolation region 202 can include silicon oxide, silicon nitride, silicon oxynitride, SiBCN, SiOCN, SiOC, or any suitable combination of those materials.

Referring still to FIG. 2, known fabrication operations have been used to, prior to formation of dummy gates 204, deposit a thin layer of gate oxide (not shown separately) over the nanosheet stack 130. In FIG. 2, the dummy gate 204 represents the combination of the thin layer of gate oxide (e.g., SiO$_2$) and a material (e.g., amorphous silicon (a-Si)) from which the dummy gates 204 are formed.

Referring still to FIG. 2, known fabrication operations (e.g., an RIE) have been used to form dummy gates 204. In embodiments of the invention, the dummy gates 204 can be formed by depositing and planarizing a layer of dummy gate material (not shown) over the gate oxide (not shown separately from the topmost nanosheet 118). In some embodiments of the invention, the dummy gate material can be polycrystalline Si. In some embodiments of the invention, the dummy gate material can be amorphous Si (a-Si). After being deposited, the dummy gate material is planarized (e.g., by CMP) to a desired level. Known semiconductor fabrication operations are used to form patterned/etched hard masks 206 on a top surface of the planarized dummy gate material. The pattern used to form the hard masks 206 defines the footprints of the dummy gates 204 and the gate oxide. In embodiments of the invention, the hard masks 206 can be formed from oxide and/or nitride materials. In embodiments of the invention, the hard masks 206 can be formed by depositing a layer of hard mask material and patterning then etching the deposited hard mask layer to form the hard masks 206. The dummy gate material is selectively etched such that portions of the dummy gate material that are not under the hard masks 206 are selectively removed, thereby forming the dummy gates 204 over the gate oxide and the nanosheet stack 130.

Referring still to FIG. 2, known fabrication operations have been used to selectively remove the portions of the gate oxide that are not under the dummy gates 204, and a DHF cleaning has been performed to ensure that all of the gate oxide that is not under the dummy gates 204 has been removed.

Referring still to FIG. 2, known fabrication operations have been used to selectively remove the bottommost SiGe 60% sacrificial nanosheet layer 120 followed by depositing dielectric material used to form offset gate spacers 208 on sidewalls of the dummy gates 204. The deposited dielectric material also fills in the space that was occupied by the removed sacrificial nanosheet layer 120, thereby forming a bottom isolation region 202. In embodiments of the invention, the offset gate spacers 208 can be formed by depositing the dielectric material over the nanosheet-base structure 100 then directionally etching (e.g., using an RIE) the dielectric material to form the gate spacers 208. In embodiments of the invention, the offset gate spacers 208 and the bottom isolation 202 can be formed from any suitable dielectric material including, for example, silicon oxide, silicon nitride, silicon oxynitride, SiBCN, SiOCN, SiOC, or any suitable combination of those materials. In some embodiments of the invention, the offset gate spacers 208 and/or the bottom isolation region 202 can be a low-k dielectric material.

Figure 3:
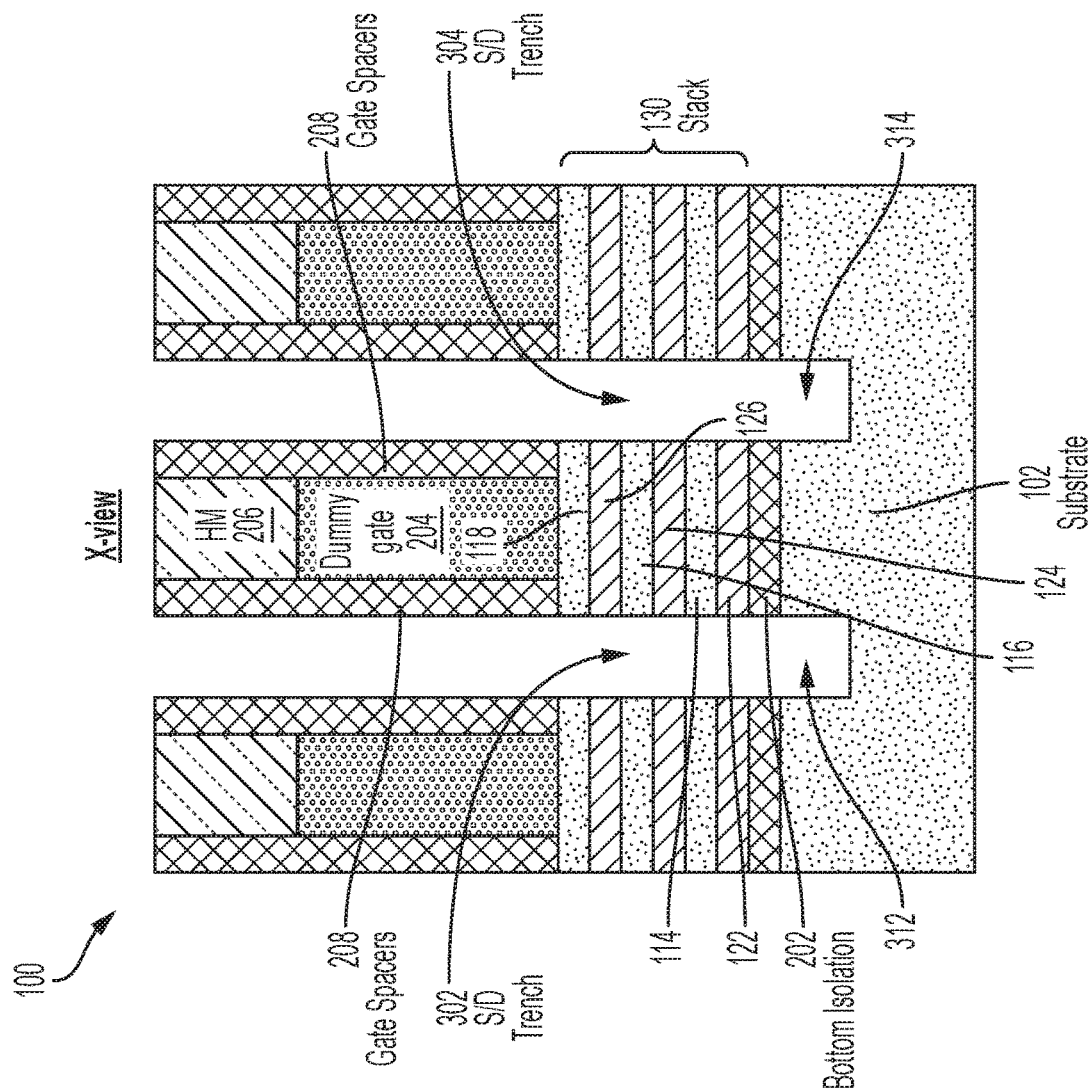

In FIG. 3, the portions of the nanosheet stack 130 that are not covered by the gate spacers 208 and the dummy gates 204 are etched, thereby forming multiple instances of the nanosheet stack 130; forming alternating layers of SiGe sacrificial nanosheets 122, 124, 126 and Si nanosheets 114, 116, 118 in each instance of the nanosheet stacks 130; forming S/D trenches 302, 304; providing access to end regions of the SiGe sacrificial nanosheets 122, 124, 126; and providing access to end regions of the Si nanosheets 114, 116, 118. In accordance with aspects of the invention, each of the S/D trenches 302, 304 includes a cavity 312, 314 that extends through the bottom isolation 202 and into the substrate 102. Of the 3 (three) nanosheet stacks 130 shown in FIG. 3, the center nanosheet stack 130 will be used to form an active nanosheet transistor. The rightmost and leftmost nanosheet stacks 130 can each be part of an active or inactive transistor depending on the requirements of the IC design in which the nanosheet-based structure 100 will be incorporated. Where the rightmost and/or leftmost nanosheet stack 130 is part of an active transistor, the active transistor formed from rightmost and/or leftmost nanosheet stack 130 will be in series with the transistor formed from the center nanosheet stack 130 and will share a source or drain region with the transistor formed from the center nanosheet stack 130. Whether or not the transistors formed from the rightmost and leftmost nanosheet stacks 130 are active, the rightmost and leftmost nanosheet stacks 130 define portions of the S/D trenches 302, 304 in which S/D regions 1202, 1204 (shown in FIG. 13) will be formed.

Figure 4:
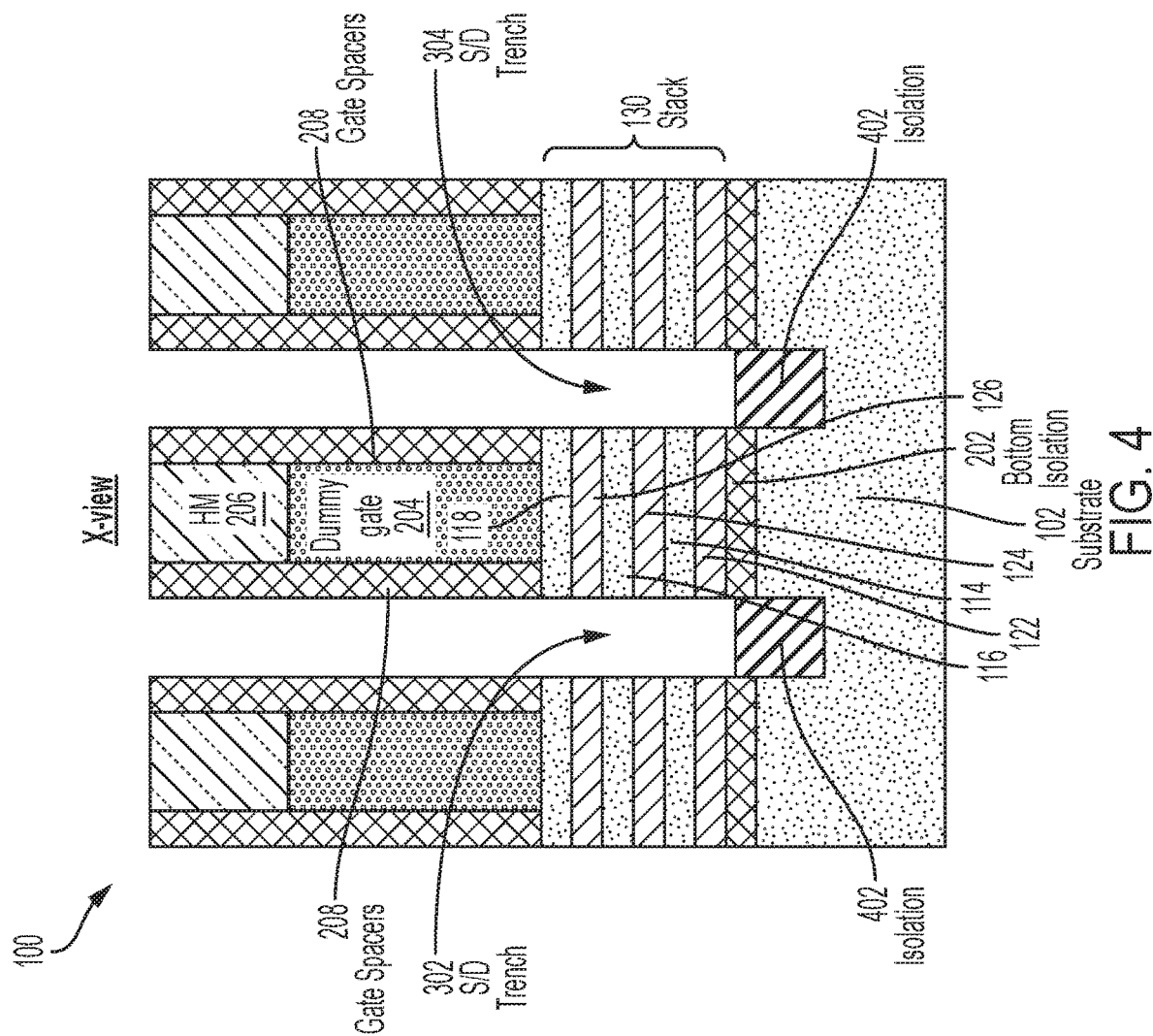

In FIG. 4, known semiconductor fabrication processes have been used to form S/D isolation regions 402 in the cavities 312, 314 (shown in FIG. 3). In accordance with aspects of the invention, a top surface of each isolation region 402 is below a top surface of the bottom isolation region 202 but above a bottom surface of the bottom isolation region 202. In some embodiments of the invention, each portion of the bottom isolation region 202 below a nanosheet stack 130 is physically coupled to one or both of the S/D isolation regions 402 as shown in FIG. 4. In some embodiments of the invention, a vertical depth dimension of the bottom isolation region 202 is less than a vertical depth dimension of each the S/D isolation regions 402. In some embodiments of the invention, a bottom surface of the bottom isolation region 202 is substantially coplanar with a top surface of the substrate, and a bottom surface of each isolation region 402 is below the top surface of the substrate. In embodiments of the invention, the isolation regions 402 can be formed by depositing a dielectric material using a high density plasma (HDP) anisotropic deposition process followed by an etch back to form the isolation regions 402. The isolation regions 402 can be formed from an oxide containing material.

Figure 5:
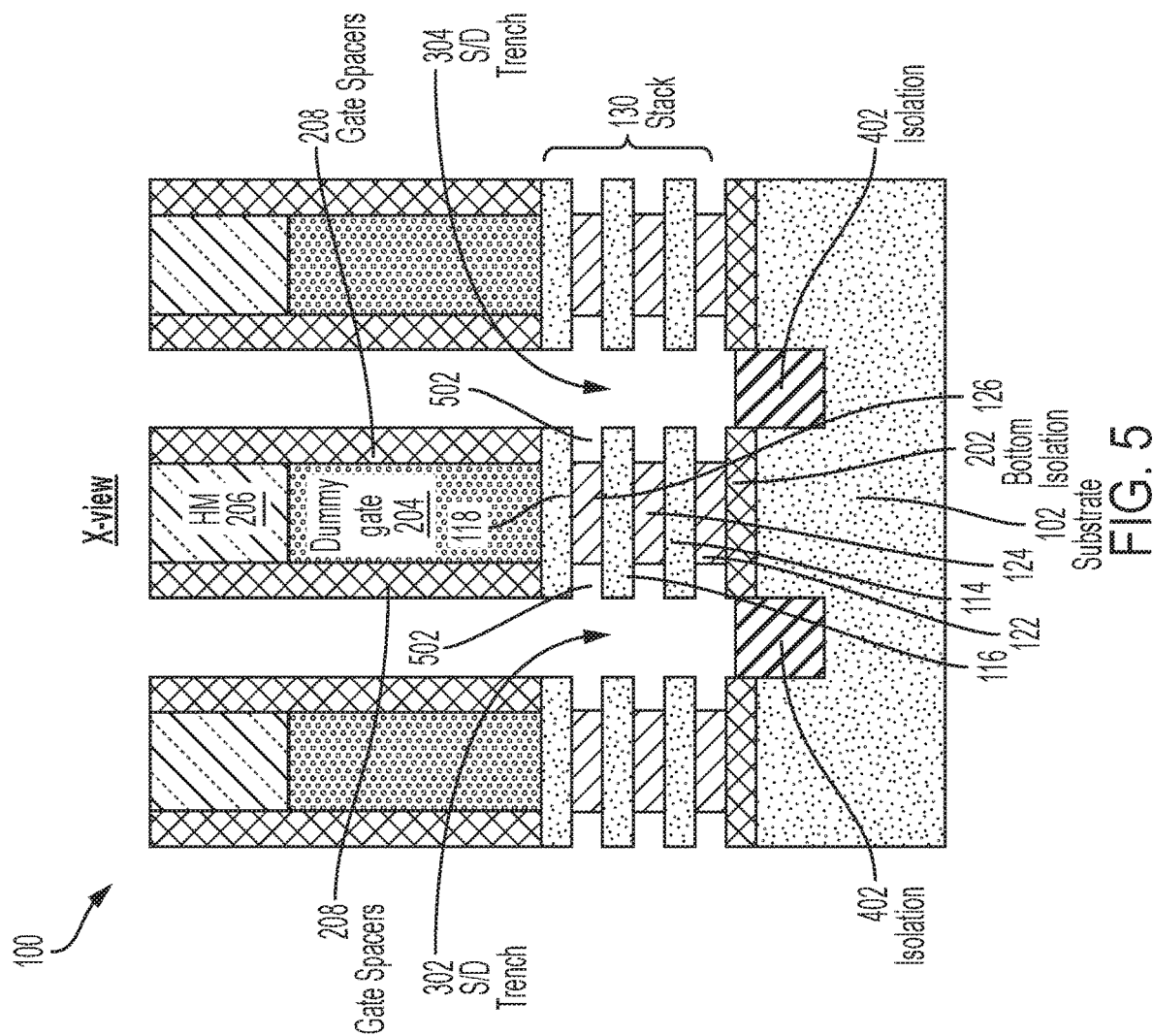

In FIG. 5, known semiconductor fabrication processes have been used to partially remove end regions of the SiGe sacrificial nanosheets 122, 124, 126 to form end region or inner spacer cavities 502. In embodiments of the invention, the end regions of the SiGe sacrificial nanosheets 122, 124, 126 can be removed using a so-called "pull-back" process to pull the SiGe sacrificial nanosheets 122, 124, 126 back an initial pull-back distance such that the ends of the SiGe sacrificial nanosheets 122, 124, 126 now terminate at about an inner edge of the gate spacers 208. In embodiments of the invention, the pull-back process leverages the fact that the sacrificial nanosheets 122, 124, 126 are formed from SiGe, which can be selectively etched with respect to the Si nanosheets 114, 116, 118 using, for example, a vapor phase hydrogen chloride (HCl) gas isotropic etch process.

Figure 6:
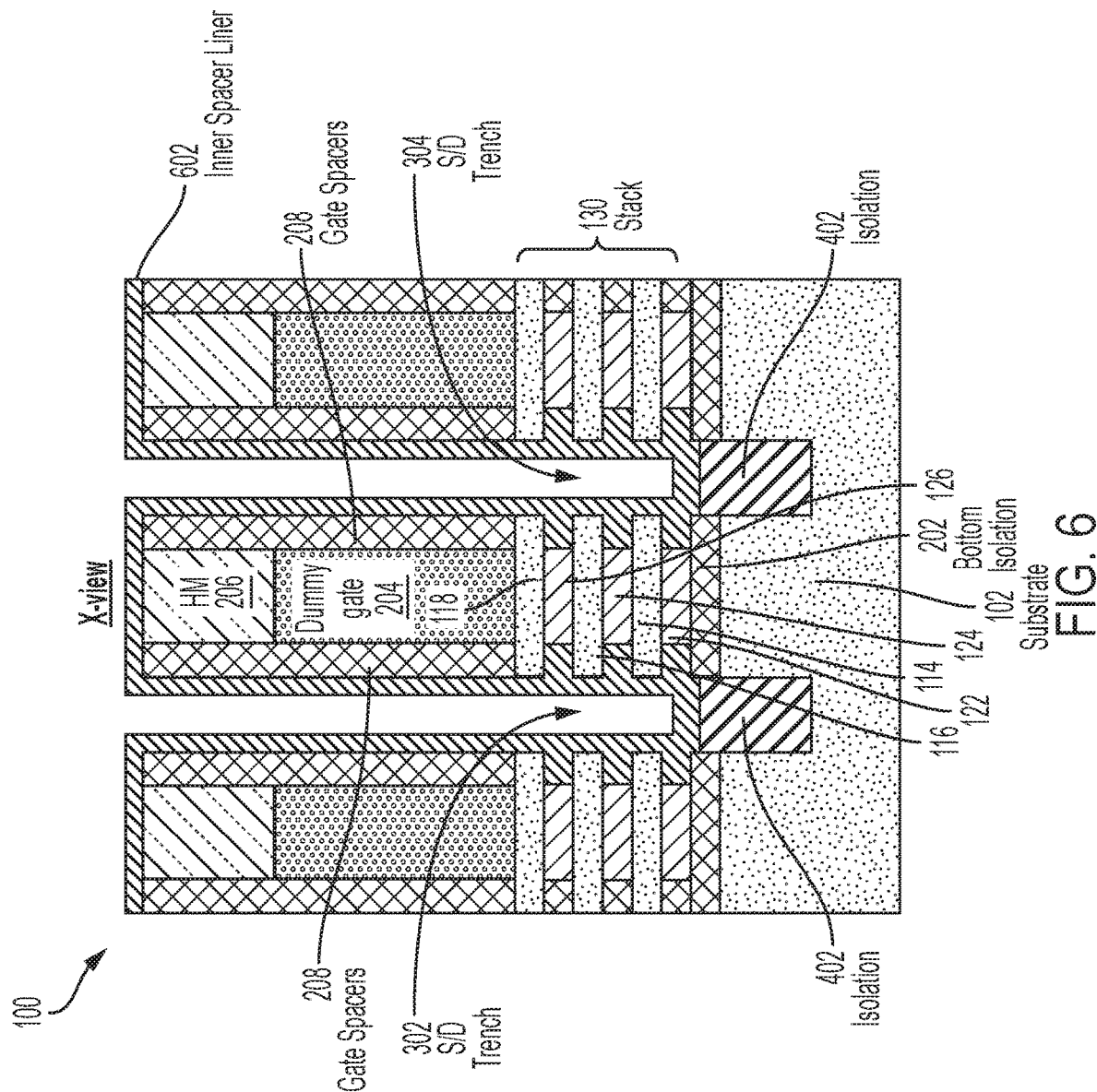

In FIG. 6, known semiconductor fabrication operations (e.g., ALD) have been used to conformally deposit a layer of inner spacer material 602 over the nanosheet-based structure 100. The inner spacer layer 602 can be silicon nitride, silicoboron carbonitride, silicon carbonitride, silicon carbon oxynitride, or any other type of dielectric material (e.g., a dielectric material having a dielectric constant k of less than about 5).

Figure 7:
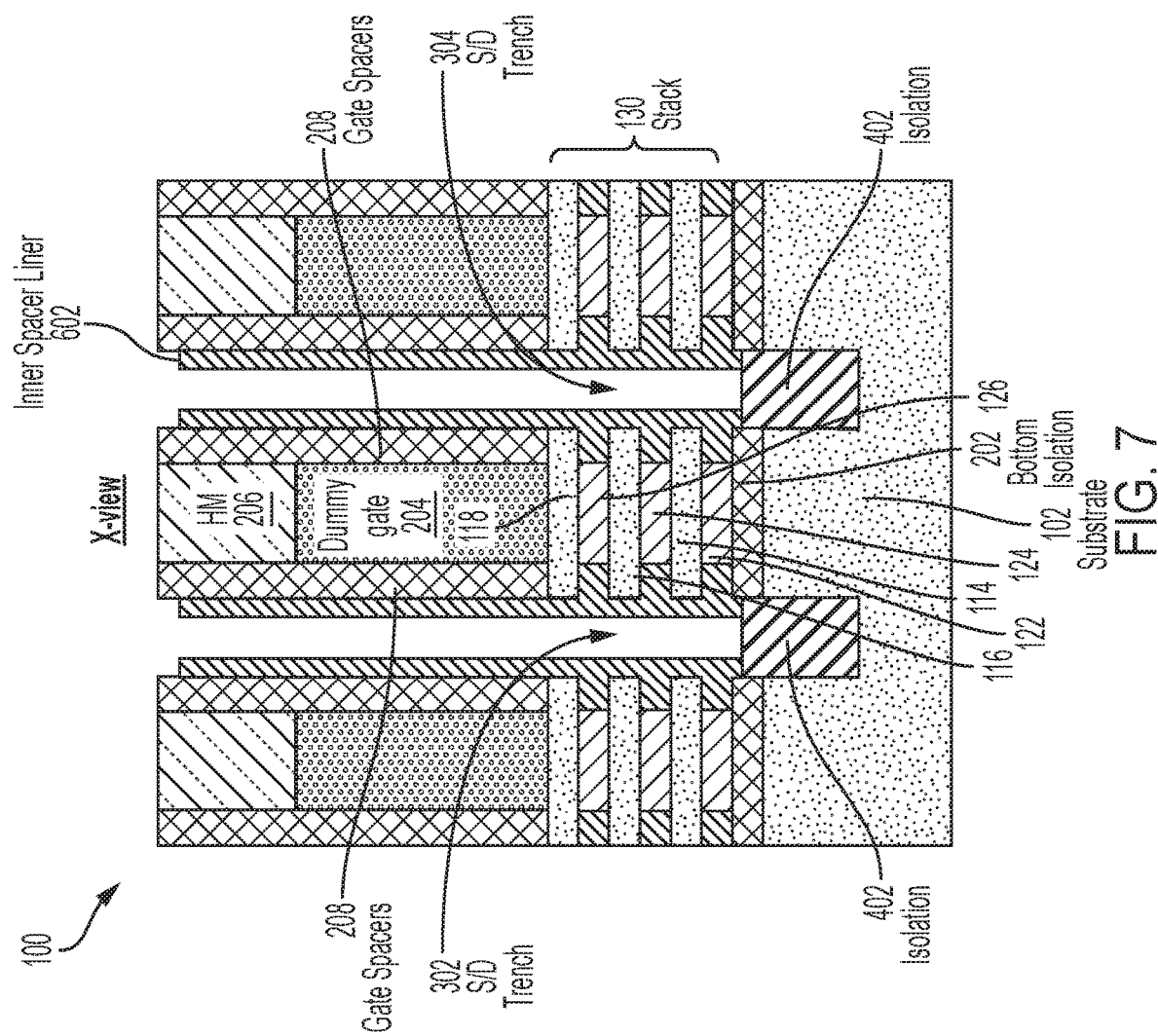

In FIG. 7, known semiconductor fabrication operations (e.g., an anisotropic RIE) can be used to remove the inner spacer material 602 from horizontal surfaces of the nanosheet-based structure 100, thereby exposing portions of the top surfaces of the isolation regions 402.

Figure 8:
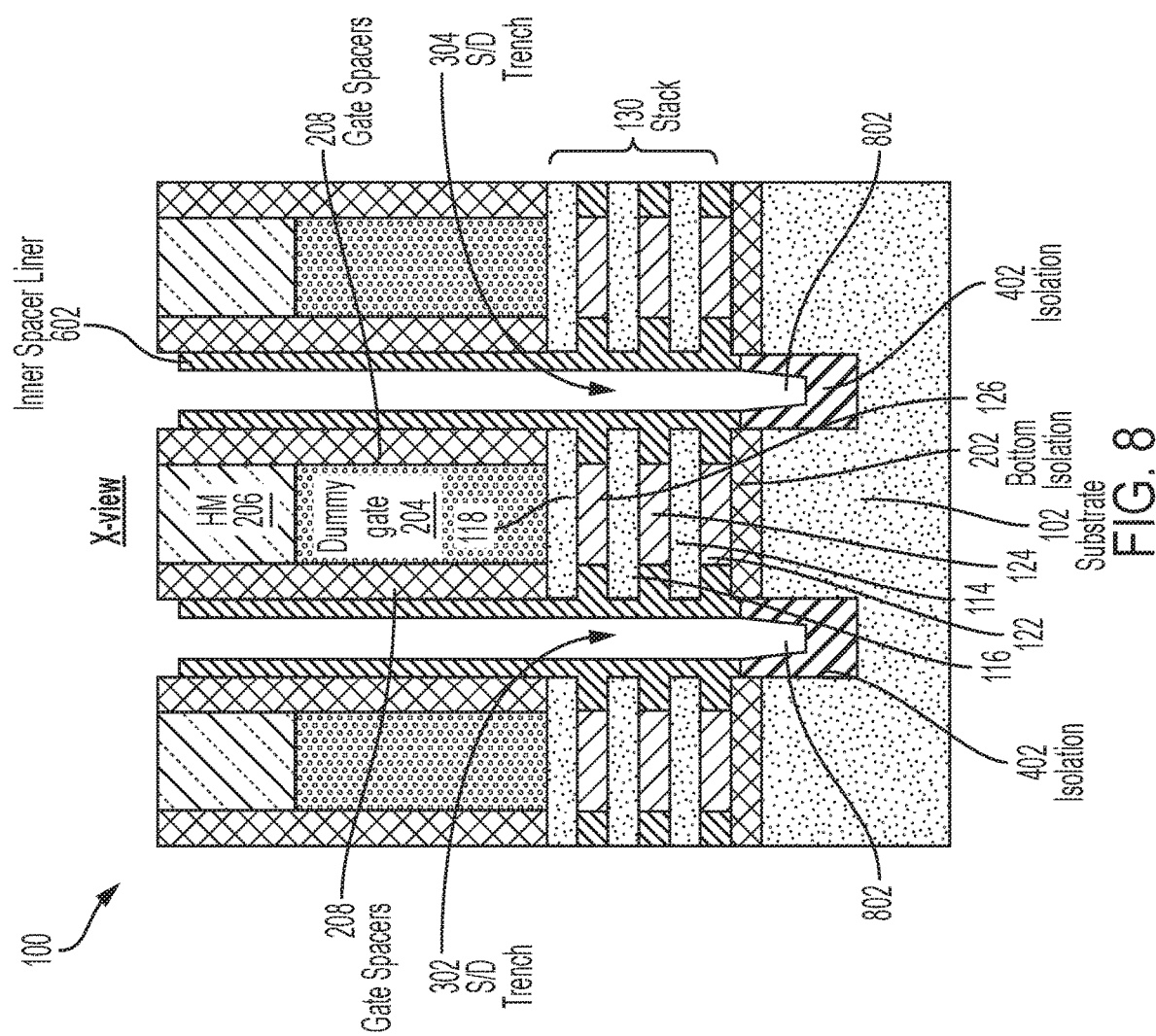

In FIG. 8, known semiconductor fabrication operations have been used to selectively etch the isolation regions 402, thereby forming isolation region cavities 802. In embodiments of the invention, a dry etch process is used to form the isolation cavities 802, which can result in the tapered sidewalls of the cavities 802. In some embodiments of the invention, an etch operation can be used to that results in substantially vertical sidewalls of the cavities 802.

Figure 9:
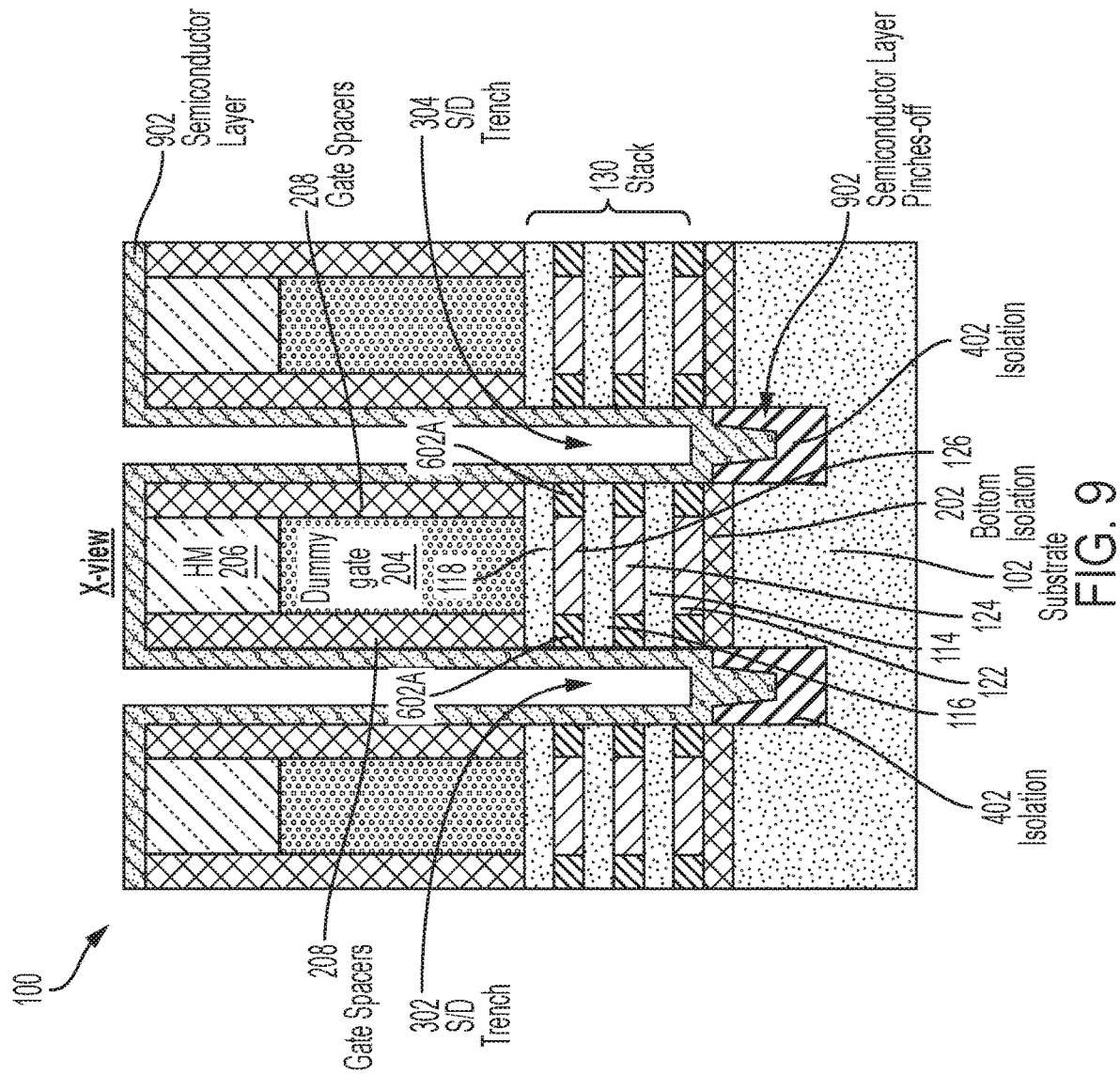

In FIG. 9, known semiconductor device fabrication processes have been used to form inner spacers 602A. In embodiments of the invention, the inner spacers 602A can be formed using by applying an anisotropic etch back on the inner spacer layer 602 (shown in FIG. 8) to remove excess dielectric material on exposed vertical and horizontal surfaces of the nanosheet-based structure 100, thus leaving the portions of the inner spacer layer 602 that pinched off in the inner spacer cavities 502 (shown in FIG. 5), thereby forming the inner spacers 602A.

Referring still to FIG. 9, subsequent to formation of the inner spacers 602A, known semiconductor fabrication operations (e.g., ALD) have been used to conformally deposit over the nanosheet-based structure 100 a semiconductor material layer 902 such that it pinches off in the isolation region cavities 802 (shown in FIG. 8). The semiconductor material layer 902 is formed from a material that can act as S/D formation assistance material in accordance with aspects of the invention. In embodiments of the invention, the S/D formation assistance material is implemented as a nucleation seed material from which the S/D regions 1202, 1204 (shown in FIG. 13) can be grown (e.g., epitaxially grown). In embodiments of the invention, the semiconductor layer 902 is undoped. In embodiments of the invention, the semiconductor layer 902 is undoped poly-silicon. In embodiments of the invention, the semiconductor layer is formed from Si, SiGe, or III-V semiconductor material, each of which can be undoped.

Figure 10:
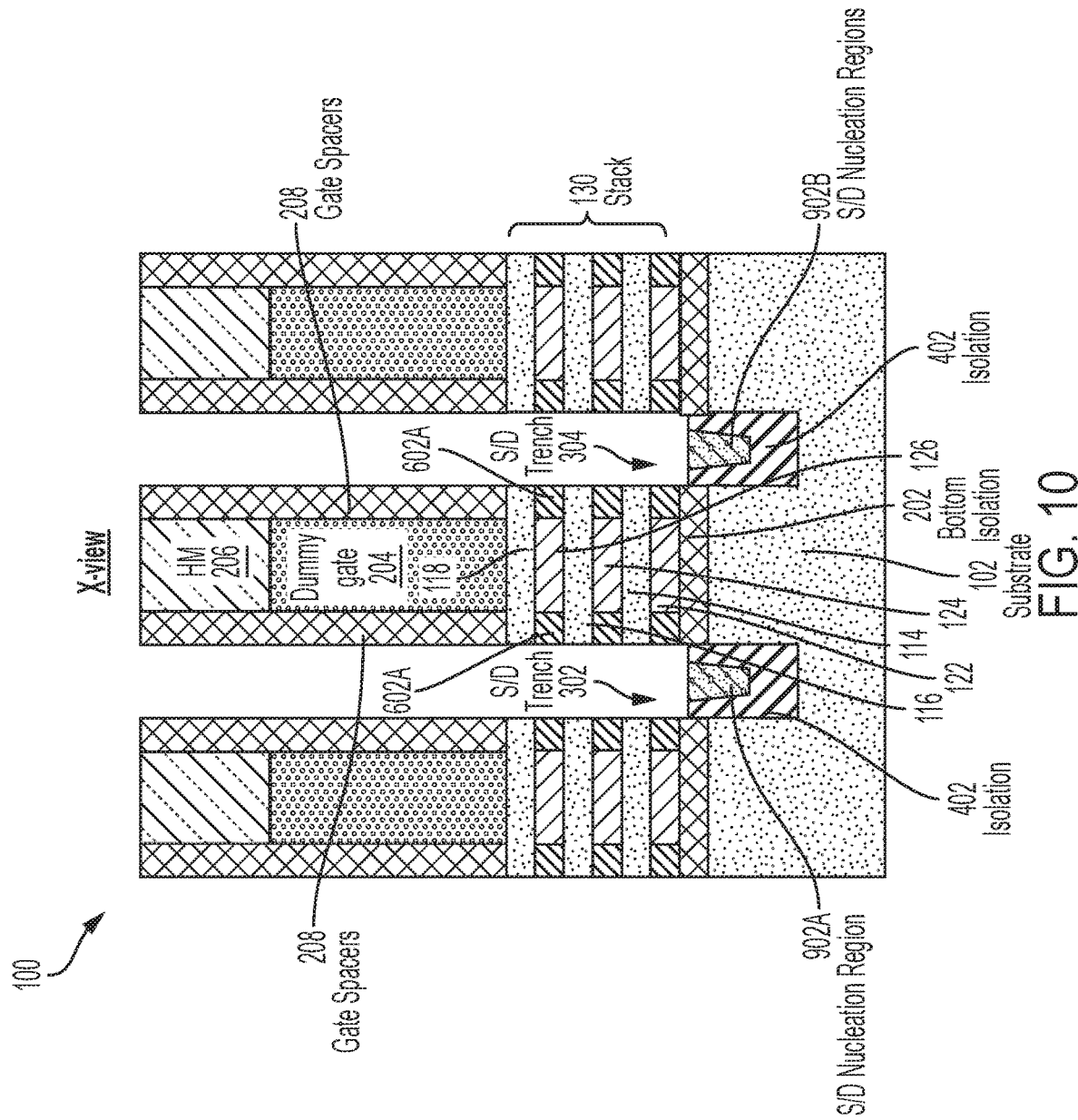

In FIG. 10, known semiconductor fabrication operations have been used to etch the semiconductor layer 902 (shown in FIG. 9), thereby forming S/D formation assistance regions, which in accordance with embodiments of the invention are implemented as embedded S/D nucleation regions 902A, 902B. Additionally, sidewalls of the S/D trench 302 are defined at least in part by sidewalls of the non-sacrificial nanosheets 114, 116, 118 of the leftmost nanosheet stack 130, as well as by sidewalls of the non-sacrificial nanosheets 114, 116, 118 of the center nanosheet stack 130. A bottom surface of the S/D trench 302 is defined at least in part by the top surface of the S/D nucleation region 902A. Similarly, sidewalls of the S/D trench 304 are defined at least in part by sidewalls of the non-sacrificial nanosheets 114, 116, 118 of the center nanosheet stack 130, as well as by sidewalls of the non-sacrificial nanosheets 114, 116, 118 of the rightmost nanosheet stack 130. A bottom surface of the S/D trench 304 is defined at least in part by the top surface of the S/D nucleation region 902B.

Figure 11:
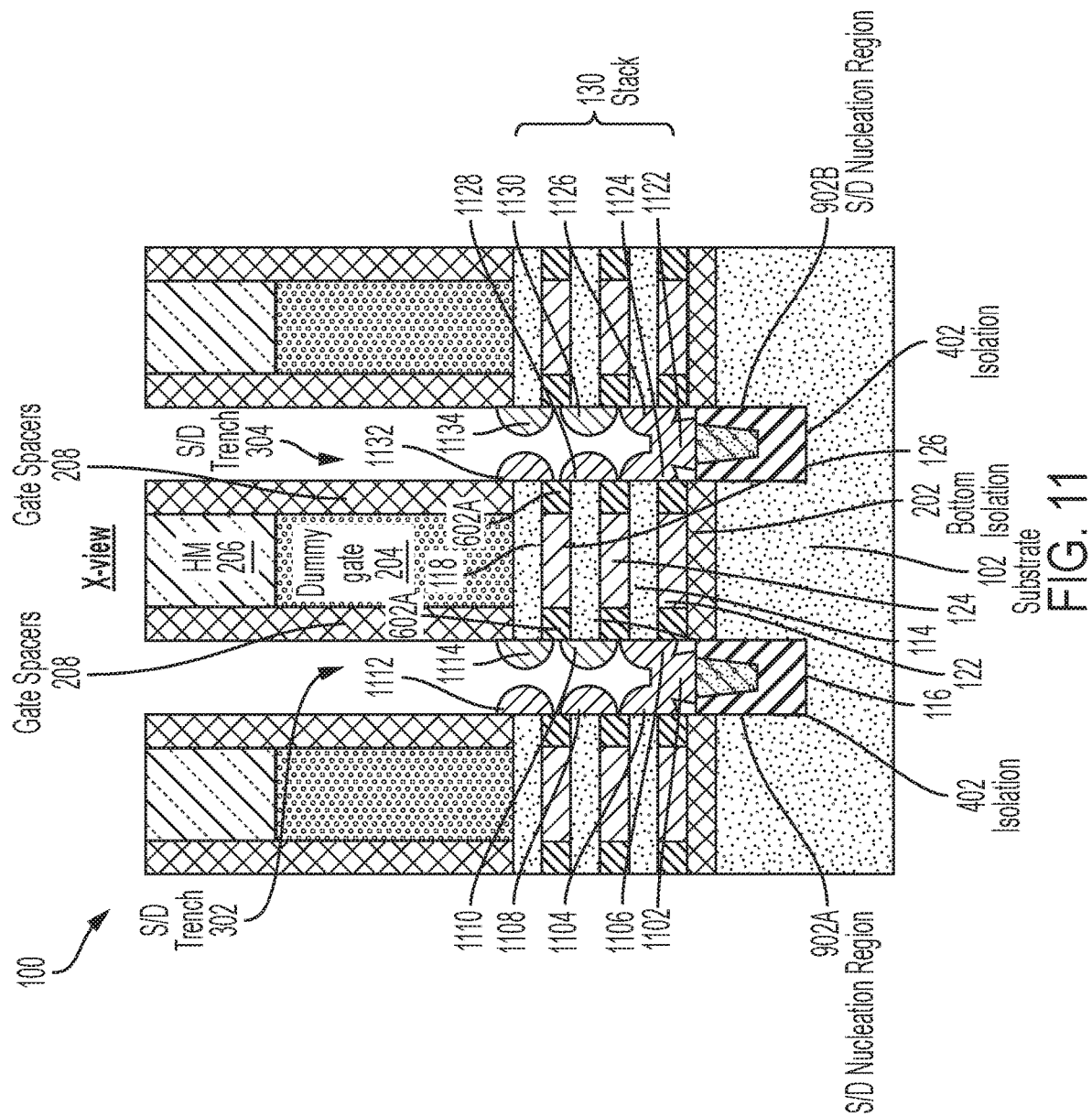

FIG. 11, known fabrication operations have been used to initiate a process for forming the doped S/D regions 1202, 1204 (shown in FIG. 13) in accordance with aspects of the invention. In embodiments of the invention, the initial stages of the process for forming the doped S/D regions 1202, 1204 uses an in-situ doped growth process to grow separate individual S/D sub-regions 1102, 1104, 1106, 1108, 1110, 1112, 1114 in the S/D trench 302, and to also grow separate individual S/D sub-regions 1122, 1124, 1126, 1128, 1130, 1132, 1134 in the S/D trench 304. In embodiments of the invention, the in-situ doped growth process can utilize gaseous or liquid precursors applied through, for example, vapor-phase epitaxy (VPE), molecular-beam epitaxy (MBE), liquid-phase epitaxy (LPE), or other suitable processes.

In the S/D trench 302, the S/D sub-regions 1104, 1106, 1108, 1110, 1112, 1114 are grown from exposed surfaces at end regions of the nanosheet layers 114, 116, 118 in the center and leftmost nanosheet stacks 130. Because of the substantially vertical orientation of the exposed surfaces at end regions of the nanosheet layers 114, 116, 118, the S/D sub-regions 1104, 1106, 1108, 1110, 1112, 1114 initially grow in a substantially lateral direction then begin to spread in a substantially vertical direction. Also in the S/D trench 302, the sub-region 1102 is grown from a top surface of the S/D nucleation region 902A. Because of the substantially horizontal orientation of the exposed top surface of the S/D nucleation region 902A, the S/D sub-region 1102 initially grow in a substantially vertical direction then begins to spread in a substantially lateral direction.

In the S/D trench 304, the S/D sub-regions 1124, 1126, 1128, 1130, 1132, 1134 are grown from exposed surfaces at end regions of the nanosheet layers 114, 116, 118 in the center and rightmost nanosheet stacks 130. Because of the substantially vertical orientation of the exposed surfaces at end regions of the nanosheet layers 114, 116, 118, the S/D sub-regions 1124, 1126, 1128, 1130, 1132, 1134 initially grow in a substantially lateral direction then begin to spread in a substantially vertical direction. Also in the S/D trench 304, the sub-region 1122 is grown from a top surface of the S/D nucleation region 902B. Because of the substantially horizontal orientation of the exposed top surface of the S/D nucleation region 902B, the S/D sub-region 1122 initially grows in a substantially vertical direction then begins to spread in a substantially lateral direction.

Referring still to FIG. 11, the in-situ doped growth process is depicted at the beginning of a first "cross-trench" S/D sub-region merger in accordance with aspects of the invention. As previously noted herein, the terms "cross-trench" refer to an S/D sub-region merger that spans the merged S/D material across the S/D trench 302 (or 304) in a manner that blocks epitaxial gas and/or liquid from flowing to structures below the cross-trench merged S/D material. In accordance with aspects of the invention, the position of the S/D nucleation regions 902A, 902B (i.e., at a bottom of the S/D trenches 302, 304, respectively) and the relatively large width dimension and/or surface area of the top surface of the S/D nucleation regions 902A, 902B ensure that first (or initial) cross-trench S/D sub-region merger occurs in the bottom of each of the S/D trenches 302, 304, and subsequent cross-trench S/D sub-region mergers occur in a predetermined sequence upward to through each of the S/D trenches 302, 304.

The following description focuses on formation of the S/D region 1202 (shown in FIG. 13) in the S/D trench region 302. However, the same processes used to form the S/D region 1202 in the S/D trench 302 are used to form the S/D region 1204 (shown in FIG. 13) in the S/D trench 304. Accordingly, in the interest of brevity, the S/D fabrication process will not be repeated for the S/D region 1204 except to note that the S/D nucleation region 902A corresponds to the S/D nucleation region 902B; the S/D sub-region 1102 corresponds to the S/D sub-region 1122; the S/D sub-region 1104 corresponds to the S/D sub-region 1124; the S/D sub-region 1106 corresponds to the S/D sub-region 1126; the S/D sub-region 1108 corresponds to the S/D sub-region 1128; the S/D sub-region 1110 corresponds to the S/D sub-region 1130; the S/D sub-region 1112 corresponds to the S/D sub-region 1132; and the S/D sub-region 1114 corresponds to the S/D sub-region 1134.

Referring still to FIG. 11, in embodiments of the invention, the position of the S/D nucleation region 902A and the relatively large width dimension and surface area of the exposed top surface of the S/D nucleation region 902A ensure that the first cross-trench merger is the S/D sub-region 1102 merging with the S/D sub-regions 1104, 1106. In accordance with aspects of the invention, the exposed surface of the S/D nucleation region 902A is larger than each of the sidewall surfaces at end regions of the non-sacrificial nanosheets. In accordance with aspects of the invention, the exposed surface of the S/D nucleation region 902A has a lateral width dimension that is larger than a vertical height (or thickness) dimension of each of the sidewall surfaces at end regions of the non-sacrificial nanosheets 114, 116, 118. In some embodiments of the invention, each of the sidewall surfaces at end regions of the non-sacrificial nanosheets 114, 116, 118 has a vertical height (or thickness) dimension that is between about 3 nm and about 8 nm.

Because the top surface of the S/D nucleation region 902A is normal with respect to (i.e., positioned at about a 90 degree angle with respect to) the sidewall surfaces at the end regions of the center nanosheet 114 and the leftmost nanosheet 114, and because the S/D nucleation region 902A has a top surface with a relatively large width dimension and/or surface area positioned relatively close to the sidewall surfaces at the end regions of the center nanosheet 114 and the leftmost nanosheet 114, the growth process applied to the S/D sub-region 1102 and the S/D sub-regions 1104, 1106 advances these S/D sub-regions (1102, 1104, 1106) toward one another in both lateral (or horizontal) directions and a vertical direction. In contrast, the S/D sub-regions 1108, 1110 are grown from surfaces that are substantially parallel with respect to one another, so the S/D sub-regions 1108, 1110 advance toward one another in only a substantially lateral direction. Similarly, the S/D sub-regions 1112, 1114 are grown from surfaces that are substantially parallel with respect to one another, so the S/D sub-regions 1112, 1114 advance toward one another in only a substantially lateral direction. Hence, the position and growth pattern of the S/D sub-region 1102 with respect to the S/D sub-regions 1104, 1106 ensures that the S/D sub-region 1102 will reach (and in effect bridge) the S/D sub-regions 1104, 1106 to form a cross-trench merged S/D region before the S/D sub-regions 1108, 1110 can cross-trench merge with one another, and before the S/D sub-regions 1112, 1114 can cross-trench merge with one another. Accordingly, the S/D sub-regions 1108, 1110, 1112, 1114 do not block the path for gas and/or liquid to flow to the bottom of the S/D trench 302, which allows the growth process applied to the first cross-trench merged S/D sub-regions 1102, 1104, 1106 to continue.

Figure 12:
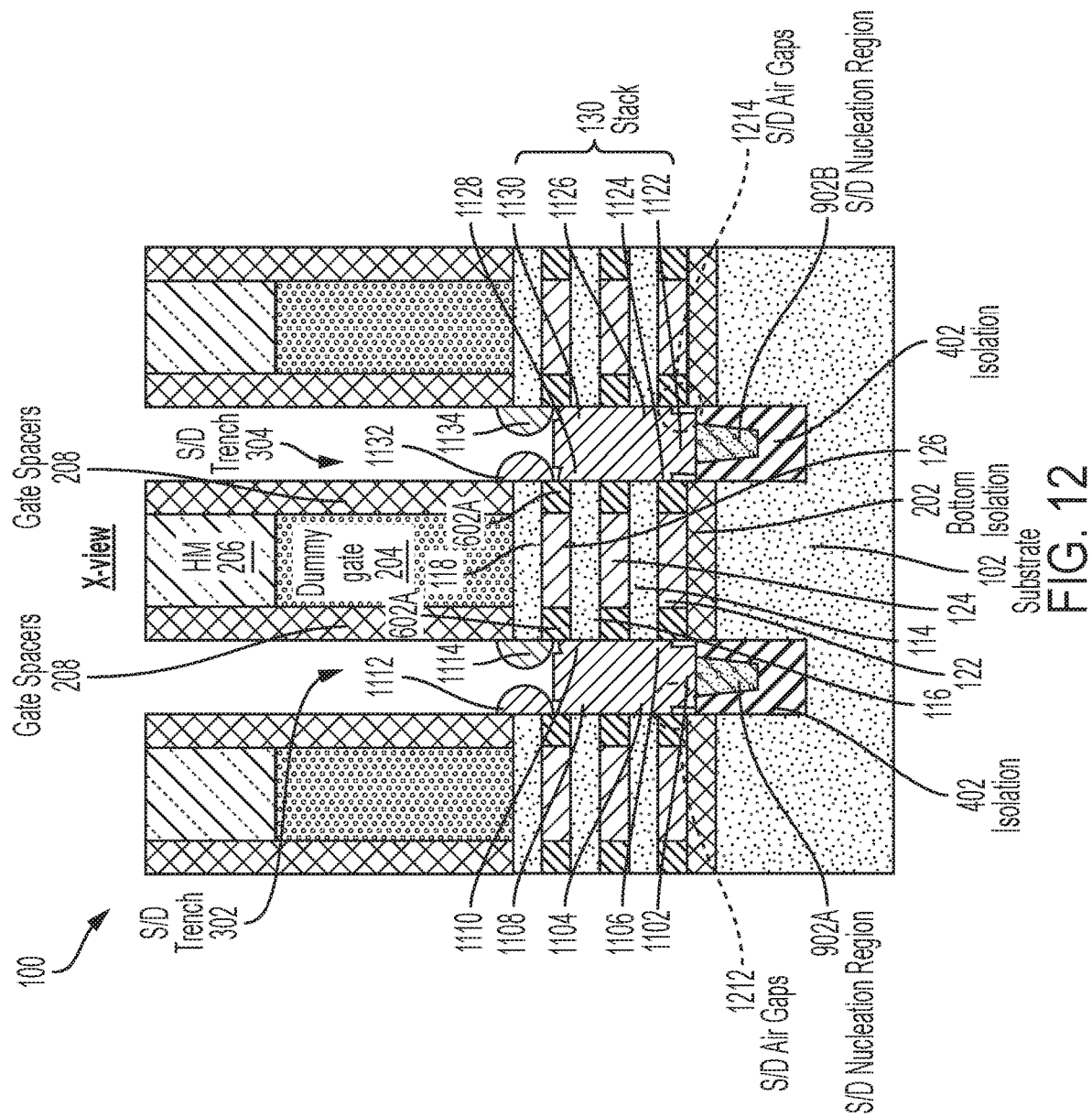

FIG. 12 depicts the in-situ doped growth process at the end of a second cross-trench S/D sub-region merger in accordance with aspects of the invention. In accordance with aspects of the invention, at the fabrication stage shown in FIG. 11, the first cross-trench merged S/D sub-regions 1102, 1104, 1106 grow faster than S/D sub-regions that have not experienced a cross-trench merger, specifically the S/D sub-regions 1108, 1110, 1112, 1114. Accordingly, as shown in FIG. 12, a second cross-trench S/D sub-region merger between the S/D sub-regions 1102, 1104, 1106, 1108, 1110 is initiated and completed before the S/D sub-regions 1112, 1114 can cross-trench merge with one another. Hence, the position and growth pattern of the S/D sub-region 1102 with respect to the S/D sub-regions 1104, 1106, 1108, 1110, as well as the faster growth rate of the cross-trench merged S/D sub-regions 1102, 1104, 1106 ensures that the cross-trench merged S/D sub-regions 1102, 1104, 1106 will reach (and in effect bridge) the S/D sub-regions 1108, 1110 to form the second cross-trench merged S/D region 1102, 1104, 1106, 1108, 1110 before the S/D sub-regions 1112, 1114 can cross-trench merge with one another.

As also shown in FIG. 12, in some embodiments of the invention, if the first (or initial) cross-trench merged S/D sub-region, which is formed from S/D sub-regions 1102, 1104, 1106, forms before the bottom region of the S/D trench 302 is completely filled with S/D material, small S/D air gaps 1212 will be formed. In embodiments of the invention, the small S/D air gaps 1212 function as a marker to indicate that a fabrication operation in accordance with aspects of the invention has been used to form the S/D regions of a transistor. However, the small S/D air gaps 1212 positioned in lower corners of the S/D regions 1202, 1204 do not reduce the solid material volume of the S/D regions 1202, 1204 enough to have a significant negative impact on the performance of the S/D regions 1202, 1204. In some embodiments of the invention, the small air gaps 1212 are between about 0% and about 20% of the total volume of each of the S/D regions 1202, 1204.

Figure 13:
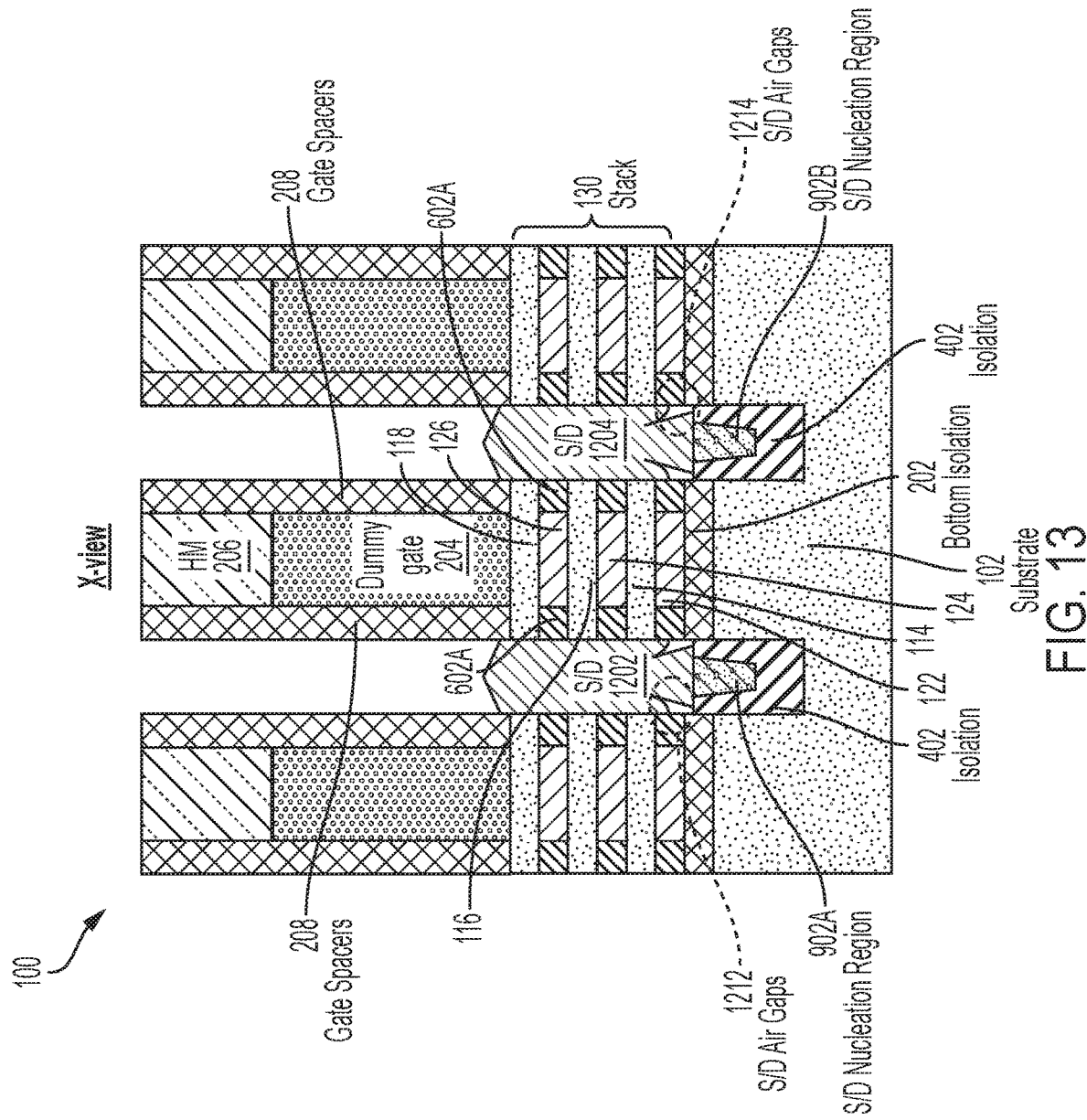

FIG. 13 depicts the in-situ doped growth process at the end of a third cross-trench S/D sub-region merger in accordance with aspects of the invention. In accordance with aspects of the invention, at the fabrication stage shown in FIG. 12, the second cross-trench merged S/D sub-regions 1102, 1104, 1106, 1108, 1110 grow faster than S/D sub-regions that have not experienced a cross-trench merger, specifically the S/D sub-regions 1112, 1114. Accordingly, as shown in FIG. 13 the third cross-trench S/D sub-region merger between the S/D sub-regions 1102, 1104, 1106, 1108, 1110, 1112, 1114 (show in FIG. 12) results in the doped S/D region 1202.

The interface between the S/D regions 1202, 1204 and the non-sacrificial nanosheets 114, 116, 118 create initial p/n junctions. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p/n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the doped S/D regions 1202, 1204 can be doped during deposition (e.g., in-situ doped) by adding dopants such as n-type dopants (e.g., phosphorus or arsenic) or p-type dopants (e.g., Ga, B, $BF_2$, or Al) during the above-described methods of forming the doped S/D regions 1202, 1204. To reduce S/D contact resistance, the doped S/D regions 1202, 1204 can be highly doped (e.g., doping levels of about $1 \times 10^{20}$ cm$^{-3}$ to about $1 \times 10^{21}$ cm$^{-3}$) and can be formed from $Si_{1-x}Ge_x$ having a higher Ge % (e.g., Ge %≥ about 50%). In embodiments of the invention, the Ge % in the $Si_{1-x}Ge_x$ embodiments of the S/D regions 1202, 1204 can be selected to maximize the dopant solubility in the $Si_{1-x}Ge_x$ S/D regions 1202, 1204. For example, it is generally accepted that a Ge % that can maximize the B solubility in $Si_{1-x}Ge_x$ embodiments of the S/D regions 1202, 1204 is a Ge %≥ about 65%. In embodiments of the invention, the dopant concentration in the S/D regions 1202, 1204 can range from about $1 \times 10^{19}$ cm$^{-3}$ to about $2 \times 10^{21}$ cm$^3$, or between about $2 \times 10^{20}$ cm$^{-3}$ and about $1 \times 10^{21}$ cm$^{-3}$.

In embodiments of the invention, a final nanosheet transistor is formed by forming deposing an interlayer dielectric (ILD) (not shown) to fill in remaining open spaces of the nanosheet-based structure 100 (shown in FIG. 13) and stabilize the nanosheet-based structure 100. The structure 100 is planarized to a predetermined level that removes the hard masks 206. In aspects of the invention, the deposited ILD regions can be formed from a low-k dielectric (e.g., k less than about 4) and/or an ultra-low-k (ULK) dielectric (e.g., k less than about 2.5). A replacement metal gate (RMG) process is applied to the nanosheet-based structure 100 to replace the sacrificial nanosheets 122, 124, 126 and the dummy gates 204 with high-k metal gate (HKMG) structures (not shown). The dummy gates 204 and the gate dielectric (not shown) can be removed by suitable known etching processes, e.g., RIE or wet removal processes. Known semiconductor fabrication operations can be used to remove the SiGe sacrificial nanosheets 122, 124, 126 selective to the Si non-sacrificial nanosheets 114, 116, 118. In embodiments of the invention, because the sacrificial nanosheets 122, 124, 126 are formed from SiGe, they can be selectively etched with respect to the Si nanosheets 114, 116, 118 using, for example, a vapor phase hydrogen chloride (HCL) gas isotropic etch process.

The HKMG structures (not shown) can be formed using any suitable known fabrication operations. Each of the HKMG structures includes a dielectric layer and a metal gate structure. The HKMG structures surround the non-sacrificial nanosheets 114, 116, 118 and regulates electron flow through the non-sacrificial nanosheets 114, 116, 118. The metal gate structure can include metal liners and work-function metals (WFM). In embodiments of the invention, the WFM can be, for example, TiN or TaN, and the metal gate structure can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent to, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

References in the specification to terms such as "vertical", "horizontal", "lateral," etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form a transistor, wherein the fabrication operations include:
    forming a source or drain (S/D) region having an S/D formation assistance region;
    wherein the S/D formation assistance region comprises a top surface, sidewalls, and a bottom surface;
    wherein the S/D formation assistance region is at least partially within a portion of a substrate; and
    forming an S/D isolation region around the sidewalls and the bottom surface of the S/D formation assistance region;
    wherein the S/D isolation region is configured to electrically isolate the S/D formation assistance region from the substrate.

2. The method of claim 1, wherein the fabrication operations further include:
    forming over the substrate a first nanosheet having a first nanosheet end region, wherein a sidewall surface of the first nanosheet end region defines a first portion of a source or drain (S/D) trench; and
    forming over the first nanosheet a second nanosheet having a second nanosheet end region, wherein a sidewall surface of the second nanosheet end region defines a second portion of the S/D trench, wherein the top surface of the S/D formation assistance region defines a bottom surface of the S/D trench;
    wherein forming the S/D region comprises:
        growing a first portion of the S/D region from the sidewall surface of the first nanosheet end region;
        growing a second portion of the S/D region from the sidewall surface of the second nanosheet end region; and
        growing a third portion of the S/D region from the top surface of the S/D formation assistance region;
    wherein the third portion merges with the second portion to form a first merged portion of the S/D region; and
    wherein, subsequent to formation of the first merged portion, the first merged portion merges with the first portion to form a second merged portion of the S/D region.

3. The method of claim 1, wherein:
    the top surface of the S/D formation assistance region is substantially horizontal; and
    a portion of the S/D region is grown from the substantially horizontal top surface of the S/D formation assistance region.

4. The method of claim 1, wherein forming the S/D region having the S/D formation assistance region further comprises:
    forming an S/D formation assistance region trench in the substrate;
    forming the S/D isolation region in the S/D formation assistance region trench; and
    depositing the S/D formation assistance region within an opening in the S/D isolation region such that the S/D isolation region electrically isolates the S/D formation assistance region from the substrate.

5. The method of claim 2 further comprising forming a bottom isolation region positioned between the first nanosheet and the substrate.

6. The method of claim 5, wherein the portion of the substrate comprises the S/D isolation region configured to electrically isolate the S/D formation assistance region from the substrate.

7. The method of claim 6, wherein the bottom isolation region is physically coupled to the S/D isolation region.

8. The method of claim 7, wherein a vertical depth dimension of the bottom isolation region is less than a vertical depth dimension of the S/D isolation region.

9. A method of performing fabrication operations to form a transistor, wherein the fabrication operations include:
    forming over a substrate a first nanosheet having a first nanosheet end region, wherein a sidewall surface of the first nanosheet end region defines a first portion of a source or drain (S/D) trench;

forming over the first nanosheet a second nanosheet having a second nanosheet end region, wherein a sidewall surface of the second nanosheet end region defines a second portion of the S/D trench;

forming over the substrate a third nanosheet having a third nanosheet end region, wherein a sidewall surface of the third nanosheet end region defines third portion of the S/D trench;

forming over the third nanosheet a fourth nanosheet having a fourth nanosheet end region, wherein a sidewall surface of the fourth nanosheet end region defines a fourth portion of the S/D trench;

forming an S/D formation assistance region within a portion of the substrate, wherein a top surface of the S/D formation assistance region defines a bottom surface of the S/D trench; and forming an S/D region in the S/D trench;

wherein forming the S/D region comprises:
growing a first portion of the S/D region from the sidewall surface of the first nanosheet end region;
growing a second portion of the S/D region from the sidewall surface of the second nanosheet end region;
growing a third portion of the S/D region from the sidewall surface of the third nanosheet end region;
growing a fourth portion of the S/D region from the sidewall surface of the fourth nanosheet end region; and
growing a fifth portion of the S/D region from the top surface of the S/D formation assistance region;

wherein, prior to the first portion merging with the third portion, the fifth portion merges with the second portion and the third portion to form a first merged portion of the S/D region.

10. The method of claim 9, wherein forming the S/D formation assistance region comprises forming a S/D formation assistance region trench in the substrate.

11. The method of claim 10, wherein forming the S/D formation assistance region further comprises forming an S/D isolation region in the S/D formation assistance region trench.

12. The method of claim 11, wherein forming the S/D formation assistance region further comprises depositing the S/D formation assistance region within an opening in the S/D isolation region such that the S/D isolation region electrically isolates the S/D formation assistance region from the substrate.

13. The method of claim 9 further comprising:
forming a first bottom isolation region positioned between the first nanosheet and the substrate; and
forming a second bottom isolation region positioned between the third nanosheet and the substrate.

14. The method of claim 13, wherein the portion of the substrate comprises an S/D isolation region configured to electrically isolate the S/D formation assistance region from the substrate.

15. The method of claim 14, wherein:
the first bottom isolation region is physically coupled to the S/D isolation region; and
the second bottom isolation region is physically coupled to the S/D isolation region.

16. The method of claim 15, wherein a vertical depth dimension of the first bottom isolation region is less than a vertical depth dimension of the S/D isolation region.

17. The method of claim 15, wherein a vertical depth dimension of the second bottom isolation region is less than a vertical depth dimension of the S/D isolation region.

* * * * *